United States Patent
Sivakumar et al.

(10) Patent No.: US 12,381,473 B2
(45) Date of Patent: Aug. 5, 2025

(54) DRIVER CIRCUIT FOR A POWER TRANSISTOR

(71) Applicant: Infineon Technologies Canada Inc., Ottawa (CA)

(72) Inventors: Arvind Sivakumar, Plano, TX (US); Yinglai Xia, Plano, TX (US)

(73) Assignee: Infineon Technologies Canada Inc., Ottawa (CA)

( * ) Notice: Subject to any disclaimer, the term of this patent is extended or adjusted under 35 U.S.C. 154(b) by 50 days.

(21) Appl. No.: 18/493,664

(22) Filed: Oct. 24, 2023

(65) Prior Publication Data
US 2025/0132658 A1    Apr. 24, 2025

(51) Int. Cl.
*H02M 1/08* (2006.01)
*H02M 1/00* (2006.01)
*H03K 17/06* (2006.01)

(52) U.S. Cl.
CPC ........... *H02M 1/0054* (2021.05); *H02M 1/08* (2013.01); *H03K 17/063* (2013.01)

(58) Field of Classification Search
CPC ...... H02M 1/0054; H02M 1/08; H03K 17/06; H03K 17/063
USPC .................................................. 327/108, 109
See application file for complete search history.

(56) References Cited

U.S. PATENT DOCUMENTS

| | | | |
|---|---|---|---|
| 9,755,639 B2* | 9/2017 | Kampl | H03K 17/74 |
| 10,498,324 B2 | 12/2019 | Chuang | |
| 2007/0257635 A1* | 11/2007 | Yang | H02J 7/0031 |
| | | | 320/107 |
| 2016/0261266 A1 | 9/2016 | Kampl et al. | |
| 2020/0389168 A1* | 12/2020 | Lee | H03K 17/74 |
| 2021/0320653 A1* | 10/2021 | Nosaka | H03K 17/162 |
| 2023/0387912 A1* | 11/2023 | Nosaka | H03K 17/162 |

FOREIGN PATENT DOCUMENTS

WO    2013164222 A1    11/2013

OTHER PUBLICATIONS

Extended European Search Report received for application No. / patent No. 24208324.4-1211 Feb. 28, 2025, 9 pages.

* cited by examiner

*Primary Examiner* — William Hernandez
(74) *Attorney, Agent, or Firm* — WORKMAN NYDEGGER

(57) ABSTRACT

A driver circuit for a power transistor. The driver circuit allows for robust turn-off of the power transistor, and for reduced power losses when the power transistor transitions back on. The driver circuit controls what voltage is applied to the gate terminal of the power transistor. The driver circuit prevents unintended turn-on of the power transistor by applying a negative voltage to the gate terminal of the power transistor when transitioning off. The driver circuit allows for reduced power losses when transitioning back on by allowing the gate terminal of the power transistor to increase from the negative voltage to a less negative voltage before applying a positive voltage to turn on the power transistor.

18 Claims, 3 Drawing Sheets

DRIVER CIRCUIT FOR A POWER TRANSISTOR

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the drain terminal and the source terminal. When the transistor is off, lesser or no current flows through the semiconductor channel region between the drain terminal and the source terminal. The gate terminal is disposed over the semiconductor channel region between the drain terminal and the source terminal. Voltage on the gate terminal generates a field that affects whether the semiconductor channel region conducts current-hence the term "field-effect transistor".

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a driver circuit for a power transistor. The driver circuit allows for both robust turn-off of the power transistor, and for reduced power losses when the power transistor transitions back on. The structure of the driver circuit according to the principles described herein will be discussed later. As an example, suppose that the power transistor was a power field-effect transistor that had a gate terminal that controlled whether current flowed between a drain terminal and a source terminal of the power transistor.

The driver circuit may be used to control what voltage is applied to the gate terminal of the power transistor. For example, the power transistor may be on when the driver circuit applies a turn-on voltage (e.g., positive 6 volts) to the gate terminal, whereas the power transistor may be off when the driver circuit applies a turn-off voltage (e.g., zero volts) to the gate terminal. Phenomena such as miller coupling and parasitic induction between the power transistor and the driver circuit may cause a brief residual peak in gate-to-source voltage after the power transistor has been turned off. The brief residual peak in gate-to-source voltage may be higher than a threshold voltage of the power transistor, and thus may cause unintended turn-on of the power transistor. This may cause severe damage to the power transistor, and/or to any circuit containing or coupled to the power transistor. Accordingly, in order to ensure that any brief residual peak in gate-to-source voltage of the power transistor does not exceed the threshold voltage of the power transistor after the power transistor has been turned off, the power transistor may instead be turned off by the driver circuit applying a negative turn-off voltage (e.g., negative 6 volts) to the gate terminal of the power transistor.

However, when turning the power transistor back on by applying the turn-on voltage to the gate terminal of the power transistor, the large voltage difference between the negative turn-off voltage and the positive turn-on voltage may cause significant power losses in the power transistor. The driver circuit, according to the principles described herein, robustly turns off the power transistor to thereby reduce risk of unintended turn-on, and also manages power loss when the power transistor turns back on. This is accomplished by 1) robustly turning off the power transistor by initially applying a negative turn-off voltage to the gate terminal of the power transistor, and 2) allowing the voltage on the gate terminal of the power transistor to gradually increase (e.g., to approximately negative 1 volt) before the power transistor turns back on. Accordingly, the power transistor may be turned off robustly, thus avoiding unintended turn-on, while also having a reduced voltage difference between the turn-off voltage and the turn-on voltage when transitioning back on, thus reducing power losses.

Regarding the structure of the driver circuit, the driver circuit includes a capacitor, two resistors, and a diode. The capacitor is connected between an alternating voltage source and a control terminal output node. The control terminal output node may be connected to, for example, the gate terminal of a power transistor. The alternating voltage source may provide a high voltage and a low voltage, which may respectively be a turn-on voltage and a turn-off voltage. The first resistor is connected in parallel with the capacitor. The diode has an anode and a cathode, the cathode being connected to the control terminal output node. The second resistor is connected between the anode of the diode and a negative terminal of the alternating voltage source. If the alternating voltage source alternated between, say ground and 12 volts, this structure achieves the appropriate voltages at the control terminal output node to robustly turn off the transistor, whilst allowing for managed power losses when the transistor is turned back on.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Embodiments described herein relate to a driver circuit for a power transistor. The driver circuit allows for both robust turn-off of the power transistor, and for reduced power losses when the power transistor transitions back on. The structure of the driver circuit according to the principles described herein will be discussed later. As an example, suppose that the power transistor was a power field-effect transistor that had a gate terminal that controlled whether current flowed between a drain terminal and a source terminal of the power transistor.

The driver circuit may be used to control what voltage is applied to the gate terminal of the power transistor. For example, the power transistor may be on when the driver circuit applies a turn-on voltage (e.g., positive 6 volts) to the gate terminal, whereas the power transistor may be off when the driver circuit applies a turn-off voltage (e.g., zero volts) to the gate terminal. Phenomena such as miller coupling and parasitic induction between the power transistor and the driver circuit may cause a brief residual peak in gate-to-source voltage after the power transistor has been turned off. The brief residual peak in gate-to-source voltage may be higher than a threshold voltage of the power transistor, and thus may cause unintended turn-on of the power transistor. This may cause severe damage to the power transistor, and/or to any circuit containing or coupled to the power transistor. Accordingly, in order to ensure that any brief residual peak in gate-to-source voltage of the power transistor does not exceed the threshold voltage of the power transistor after the power transistor has been turned off, the power transistor may instead be turned off by the driver circuit applying a negative turn-off voltage (e.g., negative 6 volts) to the gate terminal of the power transistor.

However, when turning the power transistor back on by applying the turn-on voltage to the gate terminal of the power transistor, the large voltage difference between the negative turn-off voltage and the positive turn-on voltage may cause significant power losses in the power transistor. The driver circuit, according to the principles described herein, robustly turns off the power transistor to thereby reduce risk of unintended turn-on, and also manages power loss when the power transistor turns back on. This is accomplished by 1) robustly turning off the power transistor by initially applying a negative turn-off voltage to the gate terminal of the power transistor, and 2) allowing the voltage on the gate terminal of the power transistor to gradually increase (e.g., to approximately negative 1 volt) before the power transistor turns back on. Accordingly, the power transistor may be turned off robustly, thus avoiding unintended turn-on, while also having a reduced voltage difference between the turn-off voltage and the turn-on voltage when transitioning back on, thus reducing power losses.

Figure 1:
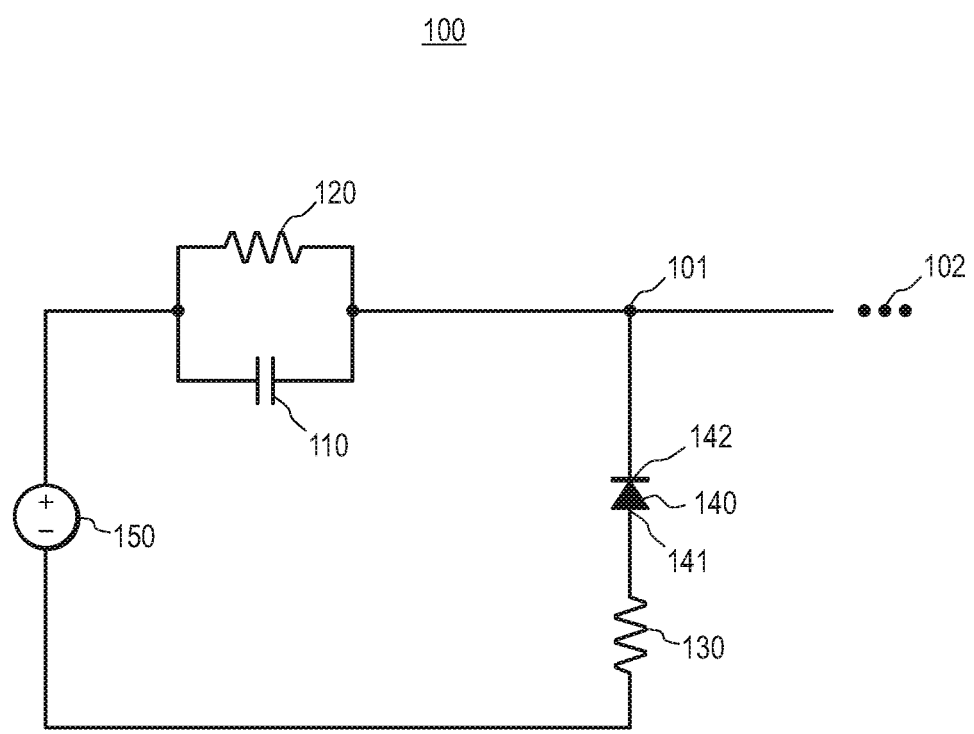
FIG. 1 illustrates a driver circuit in which the principles described herein may be practiced.

FIG. 1 illustrates a driver circuit 100 in which the principles described herein may be practiced, and is just one example of a circuit that is consistent with the principles described herein. The driver circuit 100 allows for both robust turn-off of a power transistor (not shown), and for managed power losses when the power transistor transitions back on. Specifically, the driver circuit 100 applies appropriate voltages on an output node 101 to control the on-off state of a power transistor. Accordingly, the output node 101 will be called hereinafter the control terminal output node 101.

As an example, the power transistor driven by the control terminal output node 101 may be a power field-effect transistor that has a gate terminal that controls whether current flows between a drain terminal and a source terminal of the power field-effect transistor. Thus, the control terminal output node 101 may have a gate voltage that is applied to the gate terminal of the power field-effect transistor. As one more specific example, the power transistor may be a gallium-nitride field-effect transistor. However, the principles described herein are not limited to the particular type of the power transistor. For purposes of explanation, suppose hereinafter an example in which the power transistor is indeed a power field-effect transistor. This example will be frequently used when explaining the operation of the driver circuit 100 of FIG. 1.

The driver circuit 100 includes a capacitor 110, two resistors 120 and 130, and a diode 140, and may also include an alternating voltage source 150. The capacitor 110 is connected between the alternating voltage source 150 and the control terminal output node 101. As an example, the control terminal output node 101 may be connected to the gate terminal of the power field-effect transistor, as represented by ellipses 102, and thus may be used to apply various voltages to the gate terminal of the power field-effect transistor. In one embodiment, the capacitance of the capacitor 110 is between 5 and 20 times larger than the gate terminal capacitance of the power field-effect transistor. In another embodiment, the capacitance of the capacitor 110 is between 10 and 15 times larger than the gate terminal capacitance of the power field-effect transistor.

The alternating voltage source 150 may provide a voltage that alternates between a high voltage (e.g., positive 12 volts) and a low voltage (e.g., zero volts) to the proximate node of the capacitor 110 (i.e., the left side of the capacitor 110), as shown in FIG. 1. The first resistor 120 is connected in parallel with the capacitor 110. A cathode 142 of the diode 140 is connected to the control terminal output node 101. The second resistor 130 is connected between an anode 141 of the diode 140 and a negative terminal of the alternating voltage source 150.

As previously described, the driver circuit 100 allows for both robust turn-off of the power field-effect transistor, and for managed power losses when the power field-effect transistor turns back on. In order to describe how the driver circuit 100 accomplishes this, an example of the operation of the driver circuit 100 will now be described.

In operation, the driver circuit 100 alternates between two operating modes-a first operating mode being when the alternating voltage source 150 provides the high voltage (e.g., positive 12 volts), and a second operating mode being when the alternating voltage source 150 provides the low voltage (e.g., zero volts). For purposes of explanation, the example of the operation of the driver circuit 100 will be described using example voltages. However, the principles described herein are not limited to any particular voltages provided by the alternating voltage source 150 during either operating mode. Other voltages described as occurring throughout the driver circuit 100 are also for example purposes only.

Suppose that just before the first operating mode begins, the power field-effect transistor is off, that the alternating voltage source is providing zero volts, that the voltage at the control terminal output node 101 is at approximately negative 1 volt, and therefore that the capacitor 110 is charged such that the capacitor 110 carries a 1 volt voltage difference. Hereinafter, when describing the "voltage difference" carried by the capacitor 110, that voltage difference is the voltage at the left terminal of the capacitor 110 minus the voltage at the right terminal of the capacitor 110.

When the driver circuit 100 switches to the first operating mode, the alternating voltage source 150 switches from providing zero volts to providing positive 12 volts. If not for the diode 140 and the resistor 130 collectively acting as a clamping circuit, the 1 volt voltage difference over the capacitor 110 would cause the voltage at the control terminal output node 101 to almost immediately rise up to positive 11 volts.

However, the diode 140 may be a Zener diode that has a reverse breakdown voltage of approximately 5 volts. Further, a voltage difference over the resistor 130 may cause the voltage at the anode 141 of the diode 140 to be at approximately positive 1 volt. Thus, as the voltage at the control terminal output node 101 sharply increases due to the 1 volt voltage difference over the capacitor 110, the control terminal output node 101 is only allowed to increase to approximately positive 6 volts before the diode 140 experiences reverse breakdown. When the diode 140 experiences reverse breakdown, current flows down through the diode 140 and the resistor 130 to the negative terminal of the alternating voltage source 150 (e.g., to ground). Thus, the diode 140 and the resistor 130 effectively function as a clamping circuit that clamps down the voltage at the control terminal output node 101 to a maximum of approximately positive 6 volts. Also, because the control terminal output node 101 is at approximately positive 6 volts, the connected power field-effect transistor turns on.

Further, after the initial jump in voltage at the control terminal output node 101, current flows from the alternating voltage source 150, through the resistor 120, and to the control terminal output node 101. Thus, during a steady state of the first operating mode, the control terminal output node 101 is consistently supplied with charge at positive 6 volts, and the capacitor 110 is charged to have a voltage difference of 6 volts. Further, during this first operating mode, charge is supplied to the gate terminal of the power field-effect transistor via the control terminal output node 101, and any surplus charge that would cause the control terminal output node 101 to increase beyond positive 6 volts flows down through the clamping circuit of the diode 140 and the resistor 130 (e.g., to ground).

When the driver circuit 100 switches to the second operating mode, the alternating voltage source 150 switches from providing positive 12 volts back to providing zero volts. Due to the capacitor 110 having been charged to have the voltage difference of 6 volts, the voltage at the control terminal output node 101 initially drops to negative 6 volts. Accordingly, in this second operating mode, the power field-effect transistor robustly turns off, and unintended turn-on is avoided. As a side note, the exact negative voltage that the control terminal output node 101 drops down to when the driver circuit 100 first switches to the second operating mode is dependent on the capacitance of the capacitor 110. That is, using a capacitor 110 with higher capacitance would cause the control terminal output node 101 to initially drop to a more negative voltage (e.g., negative 6.5 volts), whereas using a capacitor 110 with lower capacitance would cause the control terminal output node 101 to initially drop to a less negative voltage (e.g., negative 5.5 volts).

After the initial drop in voltage at the control terminal output node 101, charge flows from the negative terminal of the alternating voltage source 150 (e.g., from ground), up through the second resistor 130, the diode 140, and to the control terminal output node 101. Additionally, current flows from the alternating voltage source 150 (e.g., from ground) through the resistor 120. These two current flows cause the voltage at the control terminal output node 101 to gradually climb from the negative 6 volts initially provided for robust turn-off of the power field-effect transistor to approximately negative 1 volt (which is the forward threshold voltage of the diode 140). Again, as a side note, how quickly the control terminal output node 101 climbs from the initial negative voltage (e.g., negative 6 volts) to the less negative voltage (e.g., negative 1 volt) is dependent on the resistance of the resistor 130. That is, using a larger resistor 130 would cause the voltage on the control terminal output node 101 to rise more slowly, whereas using a smaller resistor 130 would cause the voltage on the control terminal output node 101 to rise more quickly.

Since the alternating voltage source provides zero volts, and since the control terminal output node 101 is at approximately negative 1 volt, the capacitor 110 is charged to have a 1 volt voltage difference. Recall that this was the state of the driver circuit 100 just before the first operating mode begins. Accordingly, when the driver circuit 100 transitions from the second operating mode, back to the first operating mode, the gate terminal of the power field-effect transistor only has to increase from negative 1 volt up to positive 6 volts, instead of having to increase from, for example, negative 6 volts to positive 6 volts. Thus, power losses may be managed while transitioning the power field-effect transistor back on.

Accordingly, the driver circuit 100 allows for robust turn-off of the power field-effect transistor by initially applying a sufficiently negative voltage (e.g., negative 6 volts) to the control terminal output node 101 at the beginning of the second operating mode, thus avoiding unintended turn-on of the power field-effect transistor. Further, the driver circuit 100 allows for managed power losses when transitioning the power field-effect transistor back on. This is because the voltage at the control terminal output node 101 is allowed to increase from the initial negative voltage (e.g., negative 6 volts) to a less negative voltage (e.g., negative 1 volt) before the driver circuit 100 applies a positive voltage (e.g., positive 6 volts) to turn the power field-effect transistor back on.

As previously expressed, the principles described herein are not limited to the particular driver circuit 100 of FIG. 1. In fact, the combination of the concepts of robust turn-off of a power field-effect transistor and managed power losses when transitioning the power field-effect transistor back on, may be useful in a variety of circuits. For example, these concepts may be applicable in a variety of modified DC to DC voltage converters, synchronous rectifiers, buck converters, boost converters, buck-boost converters, and the like. Further, the driver circuit 100 may itself be (or function as) a portion of a modified DC to DC voltage converter, synchronous rectifier, buck converter, boost converter, buck-boost converter, and so forth.

Figure 2:
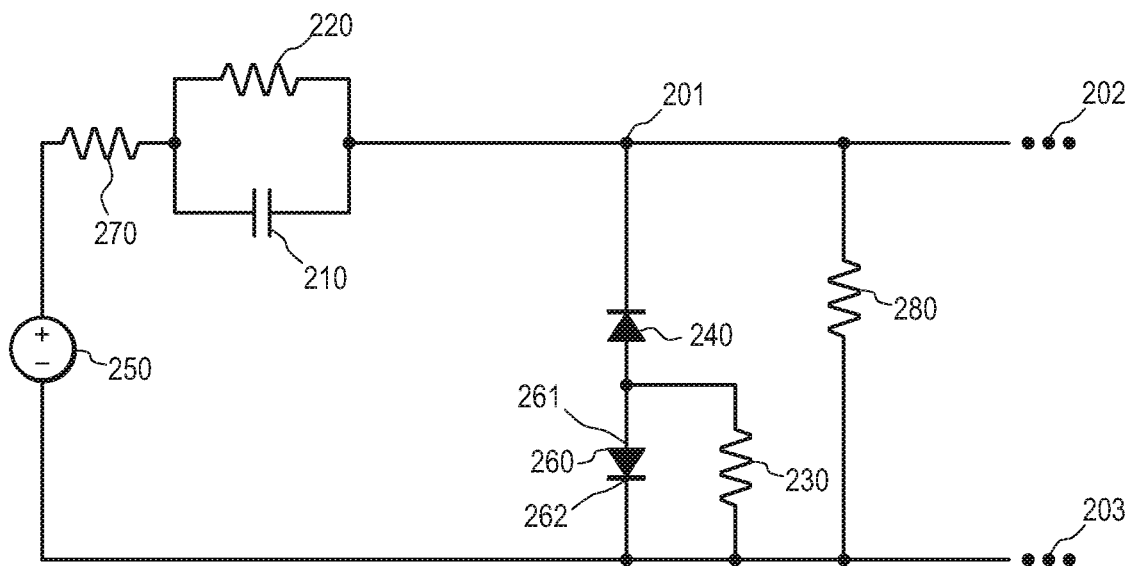
FIG. 2 illustrates a driver circuit, which is an example of the driver circuit of FIG. 1.

FIG. 2 illustrates a driver circuit 200, which is an example of the driver circuit 100 of FIG. 1. Specifically, the driver circuit 200 includes a capacitor 210, resistors 220 and 230, a diode 240, an alternating voltage source 250, and a control terminal output node 201, which are respective examples of the capacitor 110, resistors 120 and 130, the diode 140, the alternating voltage source 150, and the control terminal output node 101 of FIG. 1.

However, the driver circuit 200 further includes an additional diode 260, as well as additional resistors 270 and 280. The diode 260 has an anode 261 connected to both the resistor 230 and the anode of the diode 240. The diode 260 further has a cathode 262 connected to the negative terminal of the alternating voltage source 250.

The resistor 270 is connected between the left terminal of the capacitor 210 and the positive terminal of the alternating voltage source 250. As an example, the resistor 270 may represent an inherent switching resistance of the alternating voltage source 250. The resistor 280 is connected between the control terminal output node 201 and the negative terminal of the alternating voltage source 250. For example, similar to the circuit 100 of FIG. 1, assume that the control terminal output node 201 has a gate terminal of a power field-effect transistor connected thereto, as represented by ellipses 202. Further, suppose that the source terminal of the power field-effect transistor is connected to the negative terminal of the alternating voltage source 250, as represented by ellipses 203. In this case, the resistor 280 may represent an inherent gate-to-source resistance of the power field-effect transistor. For purposes of explanation, suppose that the resistor 270 provides a very small resistance (e.g., practically a short circuit), and that the resistor 280 provides a very large resistance (e.g., practically an open circuit).

Similar to the driver circuit 100 of FIG. 1, the driver circuit 200 of FIG. 2 has two operating modes-a first operating mode being when the alternating voltage source 250 provides a higher voltage (e.g., positive 12 volts), and a second operating mode being when the alternating voltage source 250 provides a lower voltage (e.g., zero volts). Again, for purposes of explanation, the example of the operation of the driver circuit 200 will be described using example voltages. Furthermore, the explanation of the operation of the driver circuit 200 of FIG. 2 will be described in tandem with a description of FIG. 3, which shows an example waveform of the voltage on the control terminal output node 201.

Figure 3:
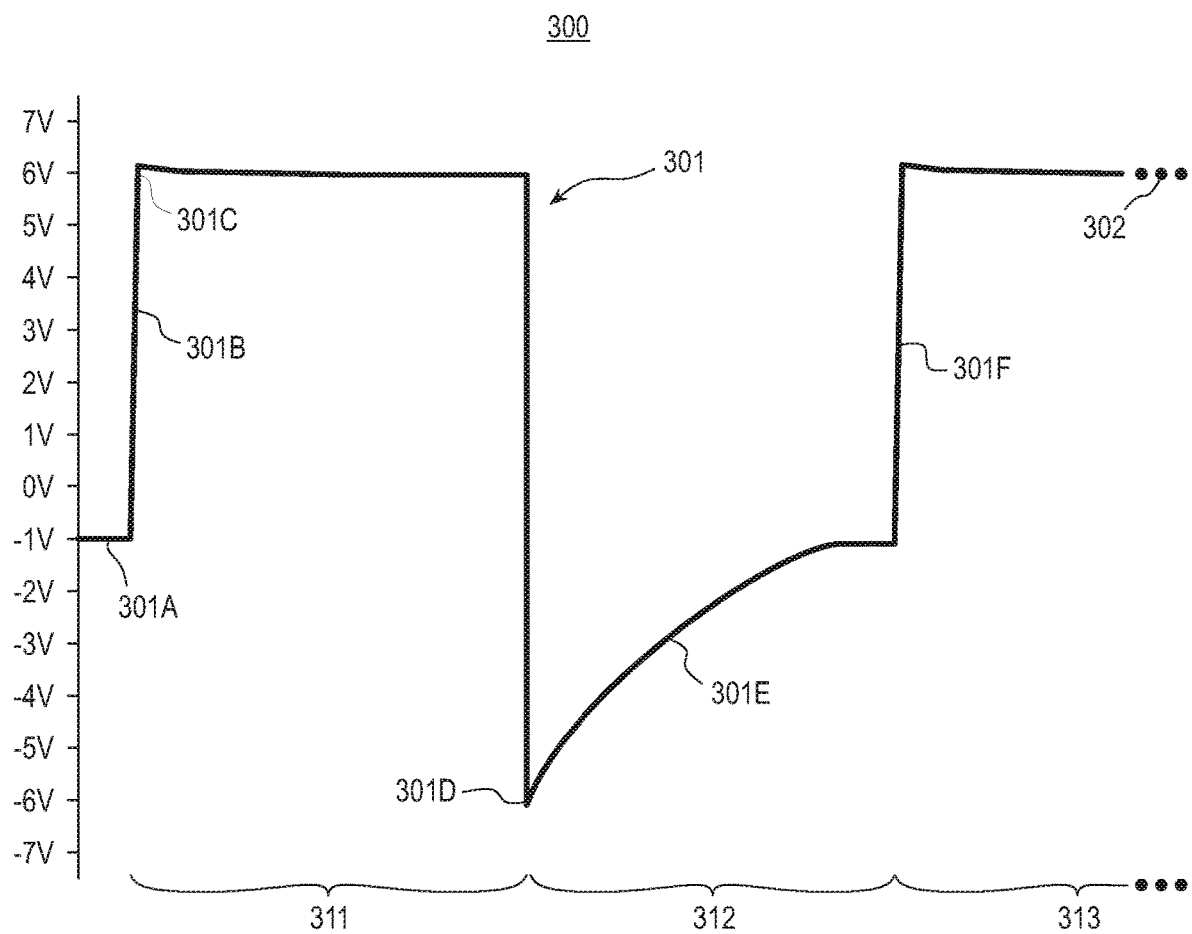
FIG. 3 illustrates a signal diagrams chart, which shows an example of a signal representing the voltage at the control terminal output node of the driver circuit of FIG. 2.

Specifically, FIG. 3 illustrates a signal diagrams chart 300, which shows an example of a signal 301 representing the voltage at the control terminal output node 201 of FIG. 2. For explanatory purposes, the signal 301 is divided into various signal portions 301A through 301F. The horizontal axis represents time passing from left to right. The vertical axis represents the amplitude of the voltage of the signal 301. The time is divided into three general time periods 311, 312 and 313. Time period 311 is when the driver circuit 200 operates in the first operating mode, time period 312 is when the driver circuit 200 operates in the second operating mode, and time period 313 is when the driver circuit 200 returns to operating in the first operating mode. As an example only, the time periods 311 and 312 may themselves each last for a few microseconds, whereas the transitions between those time periods may last for only a few nanoseconds.

Just before the first operating mode begins (just before time period 311), the power field-effect transistor is off, the alternating voltage source 250 is providing zero volts, the voltage at the control terminal output node 101 is at approximately negative 1 volt (see signal portion 301A), and the capacitor 210 is charged such that the capacitor 210 carries a 1 volt voltage difference.

At the beginning of time period 311, when the driver circuit 200 switches to the first operating mode, the alternating voltage source 150 switches from providing zero volts to providing positive 12 volts. Due to the capacitor 210 being charged, the voltage on the control terminal output node 201 rapidly increases (see signal portion 301B). However, similar to the driver circuit 100 of FIG. 1, the diode 240 and the diode 260 may be Zener diodes that have a reverse breakdown voltage of approximately 5 volts. Accordingly, the diode 240, the diode 260, and the resistor 230 collectively act as a clamping circuit that only allows the voltage at the control terminal output node 201 to increase to approximately positive 6 volts (see signal portion 301C). Since the control terminal output node 201 is at approximately positive 6 volts, the power field-effect transistor turns on.

After the initial jump in voltage at the control terminal output node 201, current flows from the alternating voltage source 250, through the resistor 270, through the resistor 220, and to the control terminal output node 201. Thus, during the remainder of the first operating mode, during time period 311, the control terminal output node 201 is consistently supplied with charge at positive 6 volts, and the capacitor 210 is charged to have a voltage difference of approximately positive 6 volts. Further, similar to the circuit 100 of FIG. 1, any surplus charge that would cause the control terminal output node 201 to increase beyond positive 6 volts flows down through the clamping circuit of the diodes 240 and 260, and the resistor 230 (e.g., to ground).

At the beginning of time period 312, the driver circuit 100 switches to the second operating mode, where the alternating voltage source 250 switches from providing positive 12 volts back to providing zero volts. Due to the capacitor 210 having been charged with the 6 volt voltage difference, the voltage at the control terminal output node 201 almost immediately drops to negative 6 volts (see signal portion 301D). As previously described, this allows for robust turn-off of the power field-effect transistor.

After the initial drop in voltage at the control terminal output node 201, charge flows from the negative terminal of the alternating voltage source 250 (e.g., from ground), up through the resistor 230, the diode 240, and to the control terminal output node 201. Further, current flows from the positive terminal of the alternating voltage source 250 (e.g., currently providing zero volts) through the resistors 270 and 220, to the control terminal output node 201. As shown in signal portion 301E, these two current flows cause the voltage at the control terminal output node 201 to gradually climb from the negative 6 volts initially provided for robust turn-off of the power field-effect transistor to approximately negative 1 volt (up to the forward threshold voltage of the diode 240). Once the control terminal output node 201 has reached approximately negative 1 volt, the capacitor 210 has been charged to have a 1 volt voltage difference, which was the initial state of the driver circuit 200 just before the first operating mode began at the beginning of time period 311.

At the beginning of time period 313, the driver circuit 200 transitions from the second operating mode, back to the first operating mode, thus causing the voltage at the control terminal output node 201 to increase from negative 1 volt to positive 6 volts (see signal portion 301F. As previously described, since the gate terminal (connected to the control terminal output node 201) of the power field-effect transistor only has to increase from negative 1 volt up to positive 6 volts, power losses may be managed while transitioning the power field-effect transistor back on. The driver circuit 200 may continue transitioning back and forth between the first operating mode and the second operating mode so as to perform proper switching of the power field-effect transistor, as represented by ellipses 302.

Accordingly, the driver circuit 200 allows for robust turn-off of the power field-effect transistor by initially applying a sufficiently negative voltage (e.g., negative 6 volts) to the control terminal output node 201 at the beginning of the second operating mode, thus avoiding unintended turn-on of the power field-effect transistor. Further, the driver circuit 200 allows for managed power losses when transitioning the power field-effect transistor back on. This is because the voltage at the control terminal output node 201 is allowed to increase from the initial negative voltage (e.g., negative 6 volts) to a less negative voltage (e.g., negative 1 volt) before the driver circuit 100 applies a positive voltage (e.g., positive 6 volts) to turn the power field-effect transistor back on.

Literal Support Section

Clause 1. A driver circuit for a power transistor, the driver circuit comprising: a capacitor having a first capacitor terminal connected to an alternating voltage source that alternates between a first voltage and a second voltage that is lower than the first voltage, the capacitor having a second capacitor terminal connected to a control terminal output node; a first resistor connected between the first capacitor terminal and the second capacitor terminal; a diode having a cathode connected to the control terminal output node, the diode further having an anode; and a second resistor connected between the anode of the diode and a negative terminal of the alternating voltage source.

Clause 2. The driver circuit according to Clause 1, the driver circuit being a portion of a synchronous rectifier.

Clause 3. The driver circuit according to Clause 1, the driver circuit being a portion of a buck converter.

Clause 4. The driver circuit according to Clause 1, the driver circuit being a portion boost converter.

Clause 5. The driver circuit according to Clause 1, the driver circuit being a portion of a DC to DC voltage converter.

Clause 6. The driver circuit according to Clause 1, wherein a capacitance of the capacitor is between 5 and 20 times larger than a control terminal capacitance of the power transistor.

Clause 7. The driver circuit according to Clause 1, wherein a capacitance of the capacitor is between 10 and 15 times larger than a control terminal capacitance of the power transistor.

Clause 8. The driver circuit according to Clause 1, wherein when the alternating voltage source provides the first voltage, the control terminal output node is at a first output voltage.

Clause 9. The driver circuit according to Clause 8, wherein when the alternating voltage source provides the second voltage, the control terminal output node is initially at a second output voltage.

Clause 10. The driver circuit according to Clause 9, the second output voltage at the control terminal output node depends on a capacitance of the capacitor.

Clause 11. The driver circuit according to Clause 9, wherein when the alternating voltage source provides the second voltage, after the control terminal output node is initially at the second output voltage, the control terminal output node gradually changes to a third output voltage.

Clause 12. The driver circuit according to Clause 11, wherein the first output voltage is a positive voltage, the second output voltage is a negative voltage, and the third output voltage is a voltage that is more positive than the second output voltage, but less positive than the first output voltage.

Clause 13. The driver circuit according to Clause 11, wherein how quickly the control terminal output node gradually changes from the second output voltage to the third output voltage depends on a resistance of the second resistor.

Clause 14. The driver circuit according to Clause 1, the diode being a first diode, the driver circuit further comprising a second diode having a cathode connected to the output of the reference voltage source, and an anode connected to the anode of the first diode.

Clause 15. The driver circuit according to Clause 14, wherein the second diode is a Zener diode.

Clause 16. The driver circuit according to Clause 15, wherein the first diode is a Zener diode.

Clause 17. The driver circuit according to Clause 1, wherein the first diode is a Zener diode.

Clause 18. The driver circuit according to Clause 1, the power transistor being a field-effect transistor.

Clause 19. The driver circuit according to Clause 1, the power transistor being a gallium-nitride field-effect transistor.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A driver circuit for a power transistor, the driver circuit comprising:
   a capacitor having a first capacitor terminal connected to an alternating voltage source that alternates between a first voltage and a second voltage that is lower than the first voltage, the capacitor having a second capacitor terminal connected to a control terminal output node, wherein a capacitance of the capacitor is between 5 and 20 times larger than a control terminal capacitance of the power transistor;
   a first resistor connected between the first capacitor terminal and the second capacitor terminal;
   a diode having a cathode connected to the control terminal output node, the diode further having an anode; and
   a second resistor connected between the anode of the diode and a negative terminal of the alternating voltage source.

2. The driver circuit according to claim 1, the driver circuit being a portion of a synchronous rectifier.

3. The driver circuit according to claim 1, the driver circuit being a portion of a buck converter.

4. The driver circuit according to claim 1, the driver circuit being a portion of a boost converter.

5. The driver circuit according to claim 1, the driver circuit being a portion of a DC to DC voltage converter.

6. The driver circuit according to claim 1, wherein a capacitance of the capacitor is between 10 and 15 times larger than a control terminal capacitance of the power transistor.

7. The driver circuit according to claim 1, wherein when the alternating voltage source provides the first voltage, the control terminal output node is at a first output voltage.

8. The driver circuit according to claim 7, wherein when the alternating voltage source provides the second voltage, the control terminal output node is initially at a second output voltage.

9. The driver circuit according to claim 8, wherein the second output voltage at the control terminal output node depends on a capacitance of the capacitor.

10. The driver circuit according to claim 8, wherein when the alternating voltage source provides the second voltage, after the control terminal output node is initially at the second output voltage, the control terminal output node gradually changes to a third output voltage.

11. The driver circuit according to claim 10, wherein the first output voltage is a positive voltage, the second output voltage is a negative voltage, and the third output voltage is a voltage that is more positive than the second output voltage, but less positive than the first output voltage.

12. The driver circuit according to claim 10, wherein how quickly the control terminal output node gradually changes from the second output voltage to the third output voltage depends on a resistance of the second resistor.

13. The driver circuit according to claim 1, wherein the first diode is a Zener diode.

14. The driver circuit according to claim 1, the power transistor being a field-effect transistor.

15. The driver circuit according to claim 1, the power transistor being a gallium-nitride field-effect transistor.

16. A driver circuit for a power transistor, the driver circuit comprising:
   a capacitor having a first capacitor terminal connected to an alternating voltage source that alternates between a first voltage and a second voltage that is lower than the first voltage, the capacitor having a second capacitor terminal connected to a control terminal output node, wherein a capacitance of the capacitor is between 5 and 20 times larger than a control terminal capacitance of the power transistor;
   a first resistor connected between the first capacitor terminal and the second capacitor terminal;
   a diode having a cathode connected to the control terminal output node, the diode further having an anode; and
   a second resistor connected between the anode of the diode and a negative terminal of the alternating voltage source, the diode being a first diode, the driver circuit further comprising a second diode having a cathode connected to the negative terminal of the alternating voltage source, and an anode connected to the anode of the first diode.

17. The driver circuit according to claim 16, wherein the second diode is a Zener diode.

18. The driver circuit according to claim 17, wherein the first diode is a Zener diode.

* * * * *